United States Patent
Cai et al.

(10) Patent No.: US 9,952,775 B2
(45) Date of Patent: Apr. 24, 2018

(54) UNUSABLE COLUMN MAPPING IN FLASH MEMORY DEVICES

(71) Applicant: SK Hynix Inc., Gyeonggi-do (KR)

(72) Inventors: Yu Cai, San Jose, CA (US); Fan Zhang, Fremont, CA (US); Chenrong Xiong, San Jose, CA (US); June Lee, Sunnyvale, CA (US); Jaesung Sim, Santa Clara, CA (US); HyungSeok Kim, Santa Clara, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/599,059

(22) Filed: May 18, 2017

(65) Prior Publication Data

US 2018/0046372 A1 Feb. 15, 2018

Related U.S. Application Data

(60) Provisional application No. 62/373,809, filed on Aug. 11, 2016.

(51) Int. Cl.
*G11C 7/00* (2006.01)
*G06F 3/06* (2006.01)

(52) U.S. Cl.
CPC .............. *G06F 3/061* (2013.01); *G06F 3/065* (2013.01); *G06F 3/067* (2013.01); *G06F 3/0619* (2013.01); *G06F 3/0688* (2013.01)

(58) Field of Classification Search
CPC . G11C 29/808; G11C 29/785; G11C 29/1849; G11C 28/848
USPC .................................................. 365/200, 201
See application file for complete search history.

(56) References Cited

U.S. PATENT DOCUMENTS

| 8,711,625 | B2 | 4/2014 | Li et al. |
| 8,966,310 | B2 * | 2/2015 | Hyde ................... G06F 11/004 714/6.13 |
| 9,146,807 | B2 | 9/2015 | Yurzola et al. |
| 9,348,694 | B1 | 5/2016 | Nassie |

(Continued)

OTHER PUBLICATIONS

RuSolut "NAND Bad Columns analysis and removal", Retrieved on Apr. 28, 2017. Retrieved from the Internet: http://rusolut.com/nand-bad-columns-analysis-and-removal/.

*Primary Examiner* — Son Dinh
(74) *Attorney, Agent, or Firm* — Kilpatrick Townsend & Stockton LLP

(57) ABSTRACT

A memory device for generating a mapping between one or more unusable columns and one or more backup columns within a memory. The memory includes a plurality of memory cells for storing data. The memory also includes a plurality of columns including a first subset of the plurality of memory cells. Each of the plurality of columns belongs to one of a plurality of data chunks. The memory further includes one or more backup columns including a second subset of the plurality of memory cells. The memory device also includes a controller communicatively coupled to the memory and configured to perform operations including identifying unusable columns, detecting a condition associated with each data chunk, and generating a mapping between the backup columns and the unusable columns based on the condition such that each of the backup columns is mapped to a different unusable column.

20 Claims, 7 Drawing Sheets

(56) References Cited

U.S. PATENT DOCUMENTS

2003/0174555 A1* 9/2003 Conley ............... G11C 11/5628
365/200

* cited by examiner

UNUSABLE COLUMN MAPPING IN FLASH MEMORY DEVICES

CROSS-REFERENCES TO RELATED APPLICATIONS

The present application claims priority to U.S. Provisional Application No. 62/373,809, entitled "BAD COLUMN FIXING POLICY IN NAND FLASH MEMORY,", filed Aug. 11, 2016, which is commonly assigned and expressly incorporated by reference herein in its entirety for all purposes.

FIELD

The present invention relates generally to systems, methods, and apparatus for storage devices, and specifically to improving performance of non-volatile memory devices

BACKGROUND

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices), are used in media storage, cameras, mobile phones, mobile computers, laptop computers, USB flash drives, etc. Non-volatile memory provides a relatively reliable, compact, cost-effective, and easily accessible method of storing data when the power is off.

Flash memory controllers are used to manage the data stored in the non-volatile memory, and to act as an interface between a host and the non-volatile memory. The uncorrectable bit-error-rate (UBER) of a memory device is of great interest to circuit designers and manufacturers, and may be influenced by flash memory controllers. There is a need for new systems, methods, and techniques for decreasing the UBER of memory devices.

SUMMARY

Embodiments of the present disclosure include a memory device for generating a mapping between one or more unusable columns and one or more backup columns within a memory. The memory device may include the memory. The memory may include a plurality of memory cells for storing data. The memory may also include a plurality of columns including a first subset of the plurality of memory cells. In some embodiments, each of the plurality of columns may belong to one of a plurality of data chunks. The memory may further include one or more backup columns including a second subset of the plurality of memory cells. The memory device may also include a controller communicatively coupled to the memory and configured to perform operations including identifying one or more unusable columns of the plurality of columns. The operations may also include detecting a condition associated with each individual data chunk of the plurality of data chunks. The operations may further include generating a mapping between the one or more backup columns and the one or more unusable columns based on the condition such that each of the one or more backup columns is mapped to a different unusable column.

In some embodiments, detecting the condition associated with each individual data chunk of the plurality of data chunks may include determining a number of unusable columns that belong to each individual data chunk and determining whether the number of unusable columns that belong to each individual data chunk exceeds a threshold. In some embodiments, the threshold may be proportional to a number of bit errors that can be tolerated in each individual data chunk using an error correction scheme. In some embodiments, the mapping may be based on determining whether the number of unusable columns that belong to each individual data chunk exceeds the threshold such that, a particular unusable column is mapped to a particular backup column only if the number of unusable columns that belong to a particular data chunk to which the particular column belongs exceeds the threshold. In some embodiments, the mapping may be based on determining whether the number of unusable columns that belong to each individual data chunk exceeds the threshold such that, for each individual data chunk, the number of unusable columns that belong to the individual data chunk minus a number of backup columns that are mapped to the unusable columns that belong to the individual data chunk is less than the threshold.

In some embodiments, the operations further include modifying the plurality of data chunks such that at least one of the plurality of columns changes with respect to which data chunk it belongs. In some embodiments, the operations further include modifying the mapping such that at least one of the one or more unusable columns changes with respect to which backup column it is mapped to. In some embodiments, a particular backup column is mapped to a particular unusable column such that the particular backup column is used for storing data instead of the particular unusable column. In some embodiments, the error correction scheme may be error correcting coding (ECC).

Embodiments of the present disclosure also include a method for generating a mapping between one or more unusable columns and one or more backup columns within a memory. The method may include identifying the one or more unusable columns of a plurality of columns. The method may also include detecting a condition associated with each individual data chunk of a plurality of data chunks. The method may further include generating the mapping between the one or more backup columns and the one or more unusable columns based on the condition such that each of the one or more backup columns is mapped to a different unusable column.

Embodiments of the present disclosure further include a controller communicatively coupled to a memory, the controller configured to perform operations including the method described above.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced.

Figure 1:
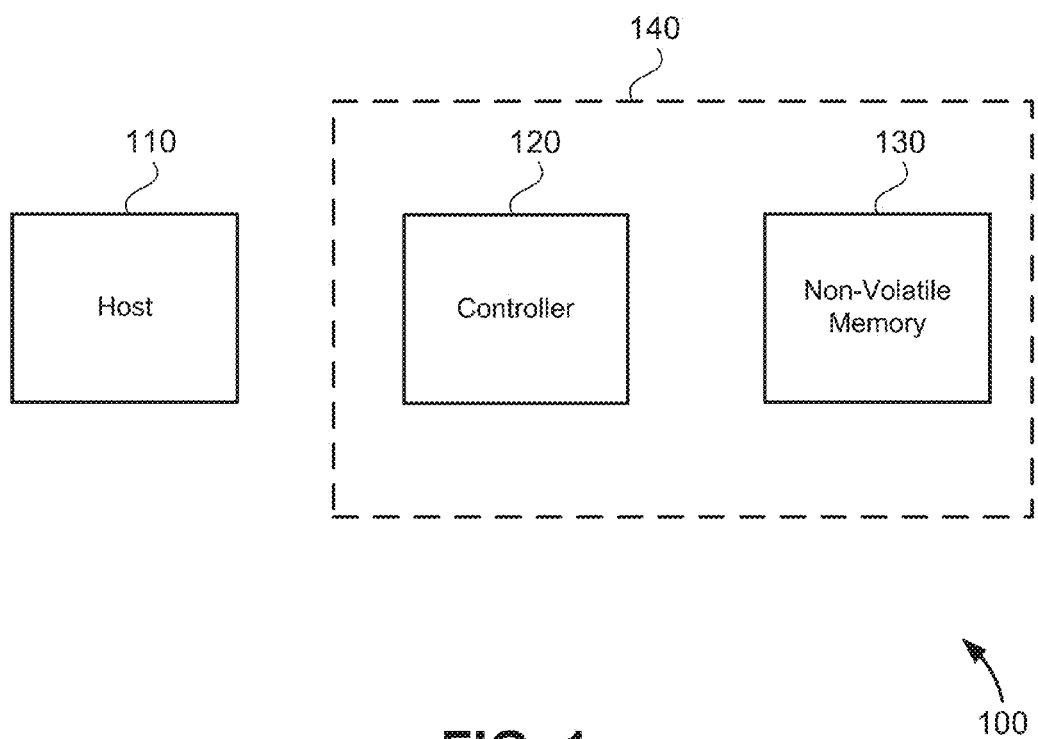
FIG. 1 shows a block diagram illustrating a system including a host, a controller, and a non-volatile memory, according to some embodiments of the present disclosure.

In the appended figures, similar components and/or features may have the same numerical reference label. Further, various components of the same type may be distinguished by following the reference label with a letter or by following the reference label with a dash followed by a second numerical reference label that distinguishes among the similar components and/or features. If only the first numerical reference label is used in the specification, the description is applicable to any one of the similar components and/or features having the same first numerical reference label irrespective of the suffix.

DETAILED DESCRIPTION

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Provided herein are embodiments for improving non-volatile memory devices by generating a mapping between unusable columns and backup columns. Unusable columns can cause significant capacity loss and yield reduction in memory devices, and if not addressed, may cause an entire die/plane/block to fail. Columns may become unusable for a number of reasons. For example, a column may become unusable when data from any one of the memory cells within the column become unreadable and/or unwriteable. Memory cells within a column may become unreadable and/or unwriteable due to defects during the manufacturing process, mechanical stress to the device prior to or during use, degradation of the dielectric material within the memory cells, among others. Although error correction schemes can tolerate some unusable columns, often the quantity and/or distribution of unusable columns cannot be fixed with error correction schemes alone. To prevent die/plane/block failure, backup columns (e.g., invisible columns and/or available columns) may be utilized to replace unusable columns. Embodiments described herein for generating column mapping improve performance of non-volatile memory devices by decreasing the uncorrectable bit-error-rate (UBER) of the memory devices, which is of great interest to circuit designers and manufacturers.

FIG. 1 shows a simplified block diagram illustrating a system 100 including a host 110, a controller 120, and a non-volatile memory 130, according to some embodiments of the present disclosure. In some embodiments, the non-volatile memory 130 can be a NAND flash memory. In other embodiments, non-volatile memory 130 can be a NOR flash memory configured to interact externally as a NAND flash memory. In some embodiments, non-volatile memory 130 can be designed to store data in the absence of a continuous or substantially continuous external power supply. In some examples, non-volatile memory 130 can be used for secondary data storage, for example, in a computer system such as a laptop. In such examples, a non-volatile memory system 140 can replace a hard disk drive (HDD). In some examples, controller 120 can be external to non-volatile memory system 140. In some such examples, controller 120 can interact with a plurality of non-volatile memories. Examples of the non-volatile memory can include read only memory (ROM), a mask ROM (MROM), a programmable ROM (PROM), an erasable programmable ROM (EPROM), an electrically erasable programmable ROM (EEPROM), Ferroelectric RAM (F-RAM), Magnetoresistive RAM (RAM), polymer-based organic memory, holographic memory, phase change memory and the like.

Host 110 can include any appropriate hardware device, software application, or a combination of hardware and software. In some embodiments, host 110 can include a host-side controller (not shown). In some embodiments, controller 120 can interface between host 110 and non-volatile memory 130. Controller 120 can be configured to receive various commands from host 110 and interface with non-volatile memory 130 based on these commands.

Figure 2:
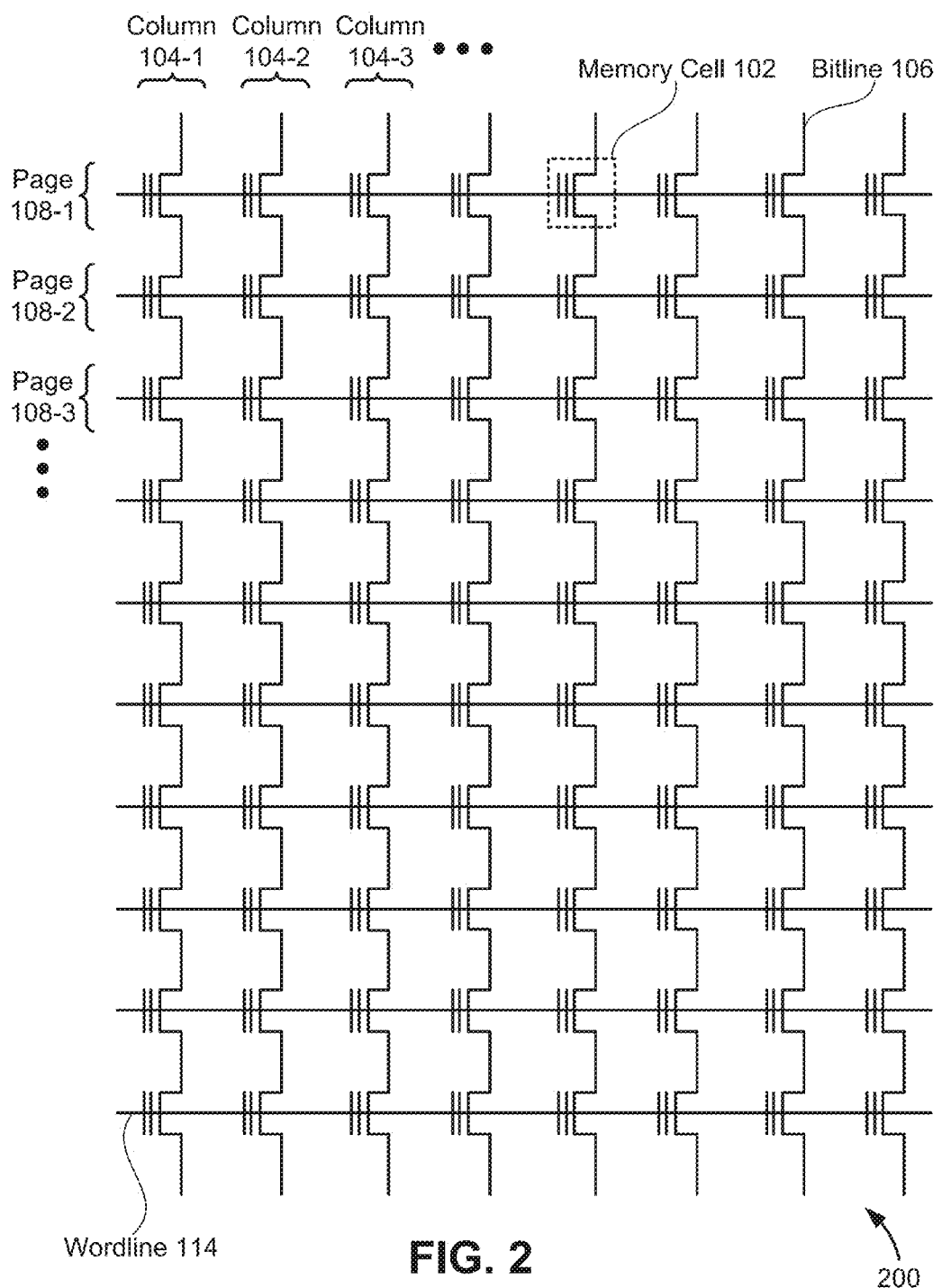
FIG. 2 shows a simplified illustration of a non-volatile memory, according to some embodiments of the present disclosure.

FIG. 2 shows a simplified illustration of a non-volatile memory 200, according to some embodiments of the present disclosure. It should be noted that the structure shown in FIG. 2 is for illustrative purposes only and the actual physical organization of the non-volatile memory 200 can differ substantially from the depiction. In the example shown in FIG. 2, non-volatile memory 200 comprises a plurality of memory cells 102 for storing data. Memory cells 102 may be floating-gate transistors such as floating-gate MOSFETs. Memory cells 102 may be grouped and/or referenced using a wide range of configurations, including columns 104, bitlines 106, pages 108, and wordlines 114. Other groupings of memory cells 102 are also anticipated, including groupings across different chips, dies, planes, among others. In some embodiments, pages 108 can represent a minimum programmable unit and a minimum readable unit.

In some instances, one or more components of non-volatile memory 200 may become unusable due to failure prior to or during operation of non-volatile memory system 140. Causes of a failure may be due to defects during the manufacturing process, mechanical stress to the device prior to or during use, degradation of the dielectric material in memory cells 102, among others. Failures may occur at the memory cell level, which may propagate and cause failures within other components of non-volatile memory 200. In some embodiments, a group of memory cells 102 may be considered to fail when no data from any one of the memory cells in the group is writable and/or readable. In some embodiments, a group may be considered to fail when at least one of the memory cells in the group is neither writable and/or readable. In such instances, an error correction scheme, such as one or more parity bits, might be used to recover the data in the failed group.

Figure 3:
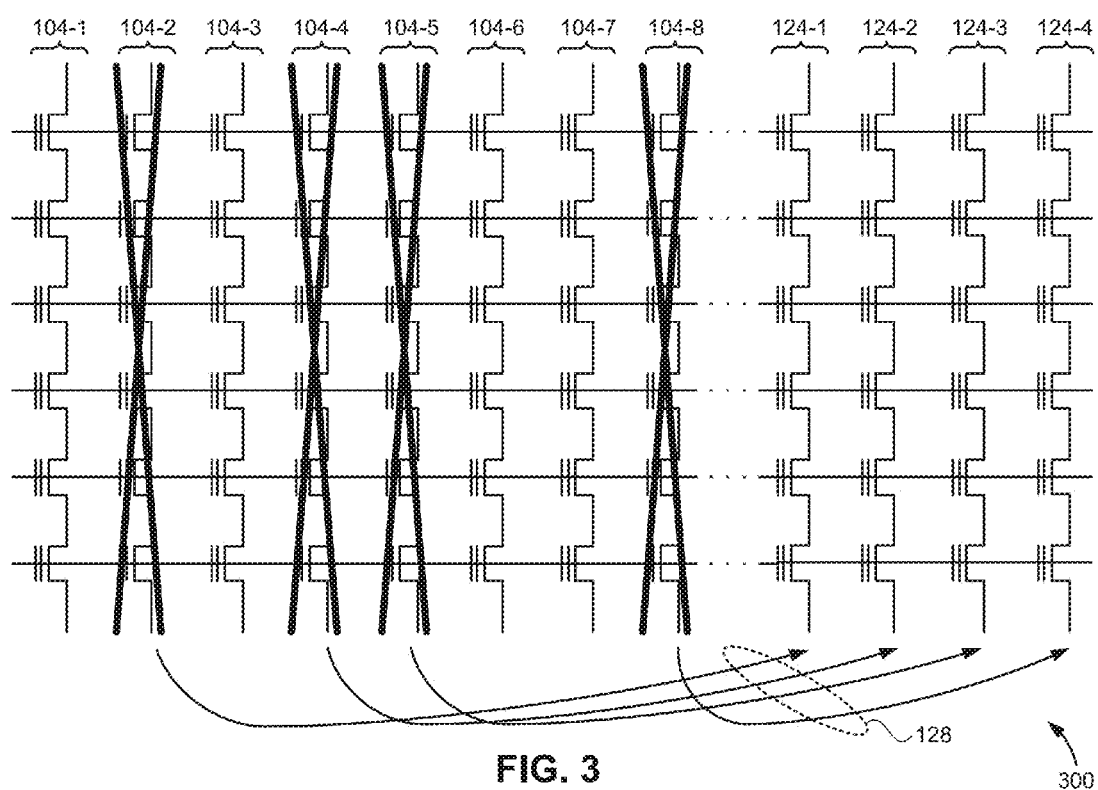
FIG. 3 shows a representation of a column mapping process, according to some embodiments of the present disclosure.

FIG. 3 shows a representation of a column mapping process 300, according to some embodiments of the present disclosure. Mapping process 300 provides a mapping 128 between one or more backup columns 124 and one or more columns that may be bad or unusable such that the unusable columns are replaced and become usable within non-volatile memory 130. As used herein, the term "plurality of columns" may refer to both backup columns 124 and columns 104. In some instance, backup columns 124 may be initially invisible to controller 120 such that they are initially unknown and/or inaccessible to controller 120. In some instances, backup columns 124 are initially known and accessible to controller 120 but are unused for various reasons.

During or prior to operation of non-volatile memory system 140, it may be discovered that one or more columns 104 are unusable (e.g., columns 104-2, 104-4, 104-5, and 104-8) and that one or more backup columns 124 are available. In such instances, controller 120 may generate a mapping between the one or more columns 104 and the one or more backup columns 124 such that any commands to read or write to any of the unusable columns results in reading or writing to one of the backup columns. This may be accomplished by mapping the address of the unusable column to the backup column or by replacing every instance of the unusable column's address in the controller's firmware with the address of the backup column, among other possibilities.

In the specific example shown in FIG. 3, columns 104 include four unusable columns 104-2, 104-4, 104-5, and 104-8. In response to detecting and identifying these unusable columns, controller 120 may generate a mapping between the unusable columns and the backup columns such that column 104-2 is mapped to backup column 124-1, column 104-4 is mapped to backup column 124-2, column 104-5 is mapped to backup column 124-3, and column 104-8 is mapped to backup column 124-4. When the number of backup columns 124 is greater than or equal to the number of unusable columns, the process for generating mapping 128 is straightforward and may include mapping unusable columns to backup columns in the order they are discovered and/or detected or in order of their physical position within non-volatile memory 130.

Figure 4:
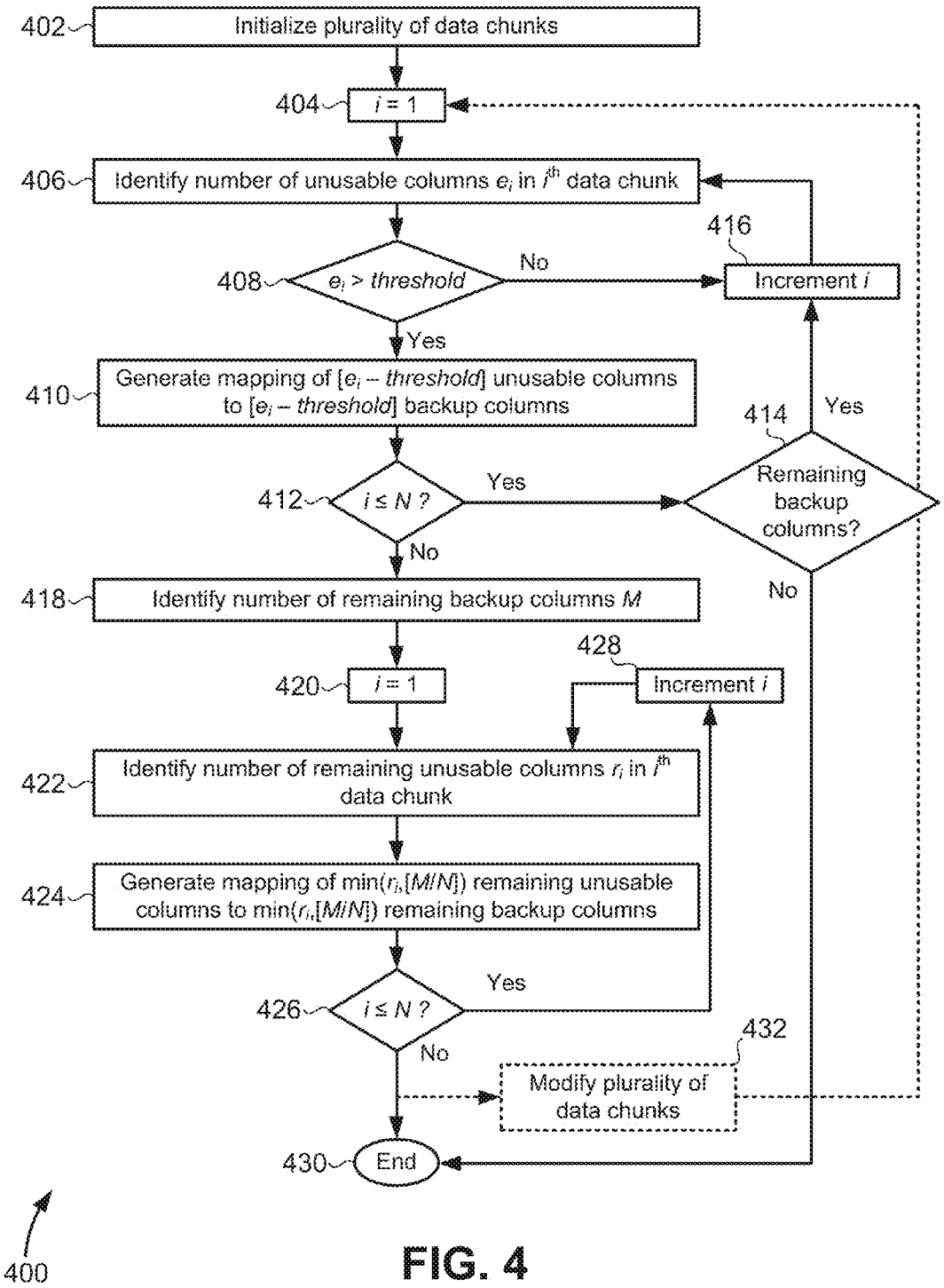
FIG. 4 shows a representation of a process for generating a mapping between unusable columns and backup columns, according to some embodiments of the present disclosure.

FIG. 4 shows a representation of a process 400 for generating a mapping between unusable columns and backup columns within a non-volatile memory device, according to some embodiments of the present disclosure. One or more operations of process 400 may be performed by controller 120, and operations of process 400 may be performed in any order. In some instances, columns 104 are partitioned into a plurality of error-correcting code (ECC) data chunks 140 (as demonstrated in FIG. 5) for correcting bit errors associated with unusable columns in a specific ECC data chunk. For example, each ECC data chunk can tolerate some number of unusable columns (e.g., 1, 5, 10, 100, etc.) by correcting bit errors associated with those unusable columns. Each ECC data chunk utilizes an error correction scheme, which may be the same error correction scheme for each of the ECC data chunks 140 or different error correction schemes may be utilized in different ECC data chunks 140. For example, one ECC data chunk may utilize a parity bit error correction scheme (odd or even parity) such that the parity bit(s) can be used to correct errors in a single unusable column. Other more sophisticated error correction schemes may be utilized to tolerate more than one unusable column, such as a BCH code or a low-density parity-check (LDPC) code.

At block 402, a plurality of ECC data chunks are initialized. ECC data chunks are initialized by assigning each column 104 to a different ECC data chunk 140. Prior to assigning each column to a different ECC data chunk, a size of the ECC data chunks may be determined (i.e., number of columns in each ECC data chunk). The ECC data chunks may all have the same size or may have different sizes. In some instances, after process 400 is performed, the size of the ECC data chunks is incremented or decremented by one and process 400 is repeated. Results from various runs of process 400 may be compared. By modifying the number of columns in each ECC data chunk, the number of ECC data chunks (i.e., N) may also be modified.

At block 404, a counter i is set to a value of one. Counter i allows different ECC data chunks to be indexed during iterations through blocks 406, 408, and 410.

At block 406, the number of unusable columns $e_i$ in the $i^{th}$ ECC data chunk is identified. In some instances, block 406 may have already been performed as controller 120 may initiate process 400 as a result of identifying one or more unusable columns within non-volatile memory 130. In some instances, the number of unusable columns $e_i$ for each of the N ECC data chunks may be identified during the first iteration or first performance of block 406. For example, it may be computationally advantageous to identify all unusable columns all at once instead of identifying unusable columns in different ECC data chunks during different iterations of block 406.

At block 408, it is determined whether the number of unusable columns $e_i$ is greater than a predetermined threshold (i.e., threshold). If it is determined that the number of unusable columns $e_i$ is greater than the predetermined threshold, then process 400 proceeds to block 410. Otherwise, process 400 proceeds to block 416. In some instances, the predetermined threshold may be equal to threshold=$\alpha \times T$ where $\alpha$ is a percentage (e.g., 0.03, 0.05, 0.1, etc.) of the die/plane/block that can be assigned to be usable and T is the total number of errors that the error correction scheme can correct. In some instances, threshold corresponds to the number of bad columns that can be tolerated by the error correction scheme within a particular ECC data chunk. For example, any bad columns in excess of threshold may cause the ECC data chunk to be unusable, and in some instances, may cause the entire die/plane/block to be unusable. In some instances, threshold may not correspond to the number of bad columns that can be tolerated, but rather may be lowered such that a balanced number of unusable columns are mapped to backup columns for each ECC data chunk. For example, in some instances, if threshold is too high then all backup columns may be used on the first few ECC data chunks while remaining ECC data chunks are ignored.

At block 410, a mapping of [$e_i$-threshold] unusable columns to [$e_i$-threshold] backup columns is generated. The mapping may include internal column address mapping such that unusable columns are completely removed and subsequently inaccessible by controller 120. As block 410 is performed additional times as counter i is incremented, the mapping may be modified and then regenerated, or an additional separate mapping may be generated. In some instances, generating a mapping may include modifying an internal column address for each of the unusable columns. In some instances, [$e_i$-threshold] may not be an integer due to threshold not necessarily being restricted to whole numbers. As such, [$e_i$-threshold] may be rounded to the nearest integer. In some instances, performance of process 400 is improved when a floor function is used on [$e_i$-threshold] such that it is rounded down.

At block 412, it is determined whether counter i is less than or equal to the number of ECC data chunks N. If it is determined that i≤N, then process 400 proceeds to block 414. Otherwise, process 400 proceeds to block 418.

At block 414, it is determined whether there are any remaining backup columns. If there are remaining backup columns, process 400 proceeds to block 416. Otherwise, process 400 proceeds to block 430. In some instances, controller 120 may determine whether there is at least one remaining backup column or whether there is at least some threshold value of backup columns, and process 400 may proceed to block 418 when it is determined that there is at least one remaining backup column but not at least some threshold value of backup columns. At block 416, counter i is incremented by one and then block 406 is repeated.

At block 418, the number of remaining backup columns M is identified. In some instances, the number of remaining backup columns may be tracked and counted during performance of block 410. For example, prior to performance of process 400 a number of backup columns may be identified, and when process 400 is initialized a variable representing the number of remaining backup columns may be set. Subsequently, each time block 410 is performed the variable may be decremented by [$e_i$-threshold]. If there are no remaining backup columns, then process 400 may proceed to block 430 (not shown explicitly in FIG. 4). Otherwise, process 400 proceeds to block 420. At block 420, counter i is set (i.e., reset) to a value of one.

At block 422, the number of remaining unusable columns $r_i$ in the $i^{th}$ ECC data chunk is identified. If there no remaining unusable columns $r_i$ in the $i^{th}$ ECC data chunk, then process 400 proceeds to block 428 (not shown explicitly in FIG. 4). Otherwise, process 400 proceeds to block 424. In some instances, when certain ECC data chunks are found to have no remaining unusable columns, the value of N may be decreased for purposes of block 424 only in order to cause a greater number of backup columns to be mapped to other ECC data chunks than would be mapped otherwise.

At block 424, a mapping of min($r_i$,[M/N]) remaining unusable columns to min($r_i$,[M/N]) remaining backup columns is generated, where min(A,B) is a minimum function equal to the minimum of A and B. In some embodiments, [M/N] is rounded down so that there are enough backup columns available through all N iterations of blocks 422 and 424. In some instances, after N iterations of blocks 422 and 424, if any backup columns remain they may be mapped arbitrarily to any remaining unusable columns.

At block 426, it is determined whether counter i is less than or equal to the number of ECC data chunks N. If it is determined that i≤N, then process 400 proceeds to block 428. Otherwise, process 400 proceeds to block 430. At block 428, counter i is incremented by one and then block 422 is repeated. At block 430, process 400 ends.

At optional block 432, the plurality of data chunks are modified such that at least one column changes with respect to which ECC data chunk it belongs to. For example, the size of the ECC data chunks may be incremented or decremented by one and process 400 may be repeated, or the size of the ECC data chunks may remain the same but may shift with respect to the columns. After repeating blocks 404 through 426 various times using different configurations of ECC data chunks, the UBER of the memory device may be tested/detected by controller 120 and the UBERs of the different configurations may be compared. In some instances, a minimum UBER may be found and the corresponding ECC data chunk configuration may be implemented.

In some embodiments, process 400 may include an ability to claim a die/plane/block as unusable when a flag is triggered. The flag may be triggered at block 410, block 414, or prior to block 402. The flag may be triggered when it is determined that there are insufficient backup columns for mapping to unusable columns such that at least one ECC data chunk includes more unusable columns than can be tolerated using the error correction scheme. In response to determining that there are insufficient backup columns, the flag is triggered and process 400 may proceed to block 430 for termination. Alternatively, process 400 may proceed to block 432 to determine whether a different configuration of the ECC data chunks does not trigger the flag. An unusable die/plane/block may further be avoided by modifying the number of columns in each ECC data chunk.

Figure 5:
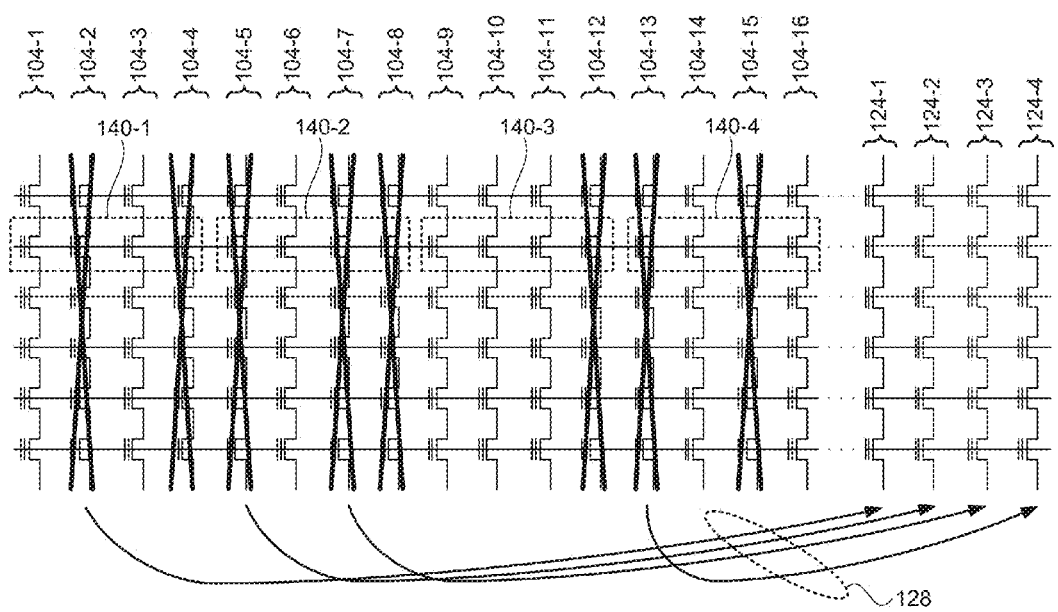
FIG. 5 shows a representation of a column mapping process, according to some embodiments of the present disclosure.

FIG. 5 shows a representation of a column mapping process 500 consistent with process 400, according to some embodiments of the present disclosure. At block 402, ECC data chunks 140-1, 140-2, 140-3, and 140-4 are initialized as shown. At block 406, two unusable columns (104-2 and 104-4) are identified in ECC data chunk 140-1 (i=1). At block 408, it is determined that the number of unusable columns in ECC data chunk 140-1 exceeds the predetermined threshold (where threshold=1, i.e., the error correction scheme utilized can tolerate one bad column per ECC data chunk). At block 410, one unusable column (104-2) is mapped to one backup column (124-1). After performance of blocks 412, 414, and 416, at block 406, three unusable columns (104-5, 104-7, and 104-8) are identified in ECC data chunk 140-2 (i=2). At block 408, it is determined that the number of unusable columns in ECC data chunk 140-2 exceeds the predetermined threshold (i.e., 3>1). At block 410, two unusable columns (104-5 and 104-7) are mapped to two backup columns (124-2 and 124-3, respectively).

After performance of blocks 412, 414, and 416, at block 406, one unusable column (104-12) is identified in ECC data chunk 140-3 (i=3). At block 408, it is determined that the number of unusable columns in ECC data chunk 140-3 does not exceed the predetermined threshold. After performance of block 416, at block 406, two unusable columns (104-13 and 104-15) are identified in ECC data chunk 140-4 (i=4). At block 408, it is determined that the number of unusable columns in ECC data chunk 140-4 exceeds the predetermined threshold (i.e., 2>1). At block 410, one unusable column (104-13) is mapped to one backup columns (124-4).

After performance of block 412, at block 418, zero remaining backup columns are identified (i.e., M=0). Process 400 may either proceed directly to block 432 (or optional block 430) or blocks 420, 422, 424, 426, and 428 may be performed iteratively N times without generating any mapping (due to $\min(r_i,[M/N])=\min(r_i, 0)=0$). At optional block 432, ECC data chunks 140 may be modified by shifting by one, two or three columns to the right or to the left.

Figure 6:
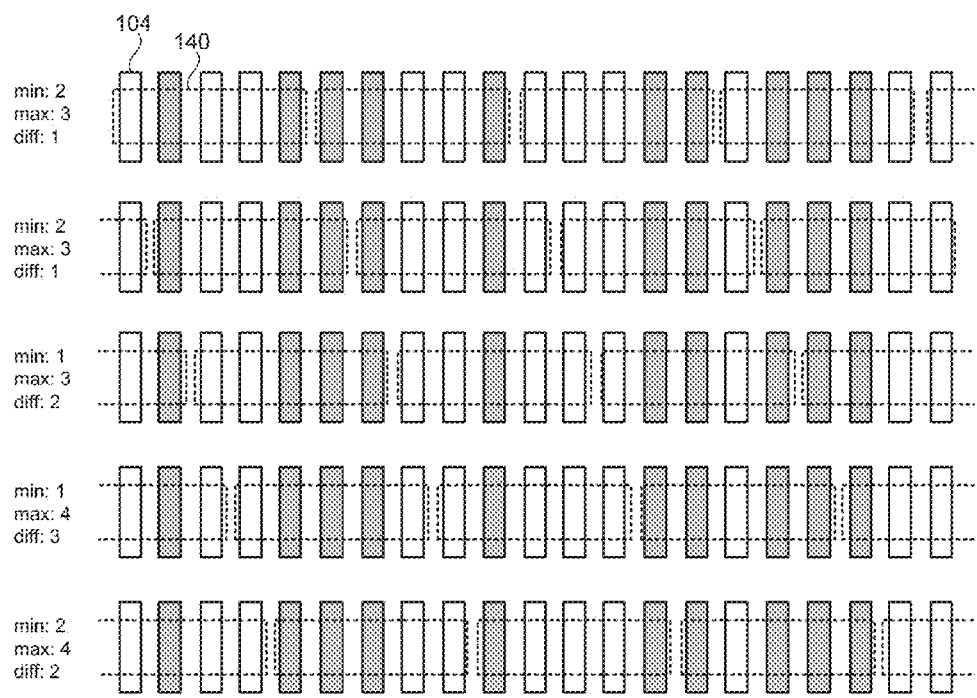
FIG. 6 shows various non-volatile memories with various configurations of error-correcting code (ECC) data chunks, according to some embodiments of the present disclosure.
Figure 6:

FIG. 6 shows various non-volatile memories with various configurations 600 of ECC data chunks 140 (with darkened columns corresponding to unusable columns), according to some embodiments of the present disclosure. In some instances, when ECC data chunks are initialized and/or modified (e.g., during blocks 402 and 432), different possible configurations using the same ECC data chunk size may be analyzed and different scores may be generated prior to initializing and/or modifying the ECC data chunks. For example, in reference to configurations 600, ECC data chunks with five columns each may be configured in at least the five configurations shown in FIG. 6. For each configuration, a minimum (i.e., "min") number of unusable columns, a maximum (i.e., "max") number of unusable columns, and a difference (i.e., "diff") between the maximum and the minimum may be generated. The minimum and maximum values are generated by counting the number of unusable columns in each ECC data chunk and determining the minimum and maximum of the resulting counts. In some instances, the configuration corresponding to the smallest difference value is selected and implemented by controller 120, as spreading unusable columns more evenly increases the UBER of the memory device. For example, in reference to configurations 600, the top two configurations have a difference value equal to one, which represent the smallest difference values of the five configurations. Either of these configurations may be implemented by controller 120. In some embodiments, this process may be repeated for all possible ECC data chunk sizes (e.g., three columns, four columns, six columns, seven columns, ten columns, etc.), and a configuration of ECC data chunks having a smaller difference value (e.g., zero) may be selected and implemented by controller 120.

Figure 7:
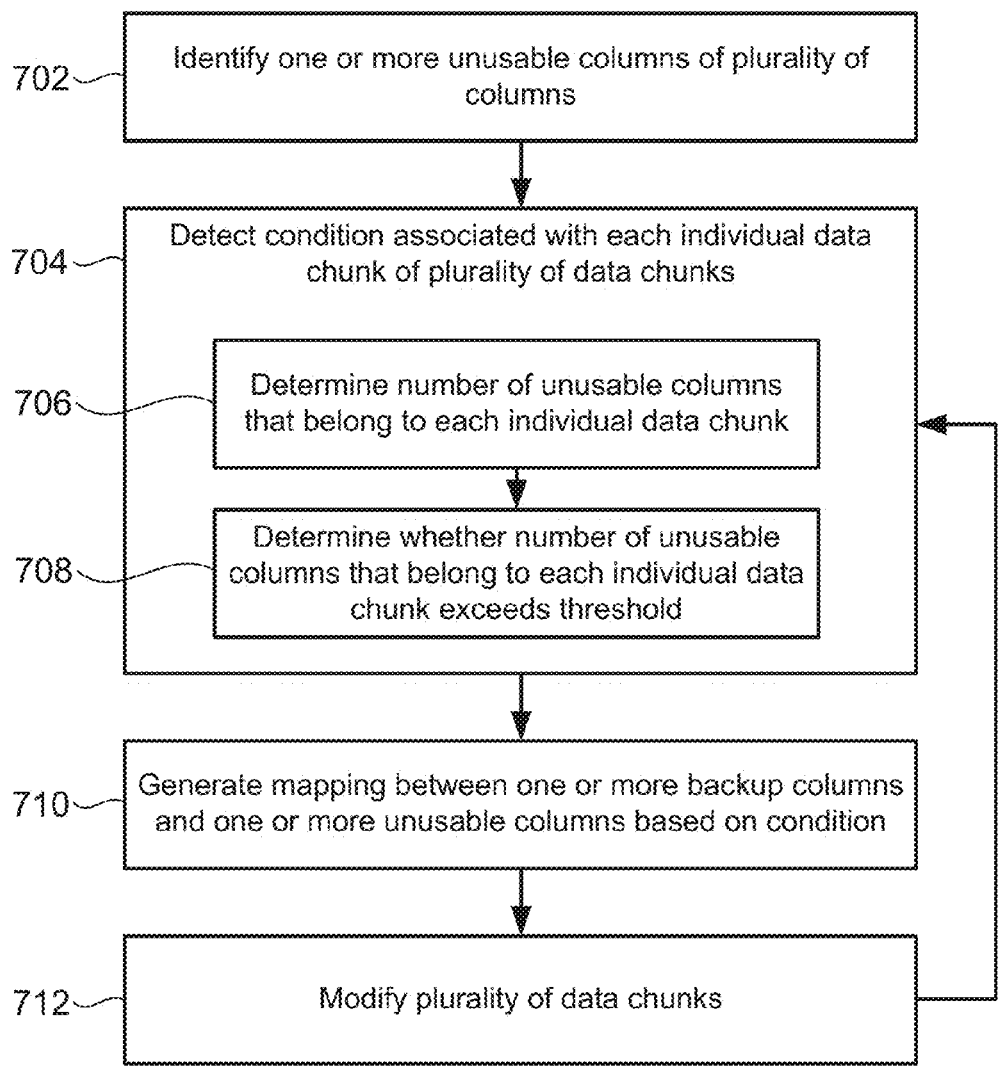
FIG. 7 shows a representation of a process for generating a mapping between one or more unusable columns and one or more backup columns within a memory, according to some embodiments of the present disclosure.

FIG. 7 shows a representation of a process 700 for generating a mapping between one or more unusable columns and one or more backup columns within a memory, according to some embodiments of the present disclosure. Process 700 may be performed in any order, and not all operations of process 700 need be performed. At block 702, one or more unusable columns of a plurality of columns are identified. The unusable columns may be identified by controller 120 by performing a diagnostic test of each of memory cells 102. The test may include an attempt to write one or more bits of data to each of memory cells 102 and subsequently read from the tested memory cells. Memory cells that return an error or an incorrect bit may be identified as unusable, and columns comprising one or more unusable memory cells may also be identified as unusable.

At block 704, a condition associated with each individual data chunk of a plurality of data chunks is detected. In some embodiments, a plurality of columns within the memory (containing the unusable columns) are grouped into different data chunks. In some embodiments, the condition may be detected by controller 120, and may be detected periodically, continuously, intermittently, or in response to a trigger, such as the number of unusable columns exceeding a threshold. For example, in some embodiments, the number of unusable columns may be determined at periodic intervals, or upon performance of block 702, and may be followed by a determination as to whether the number exceeds the threshold. The condition may be a number of unusable columns in the data chunk, a number of usable columns in the data chunk, a number of total columns in the data chunk, a bit-error rate (BER) of the data chunk, a BER of a subset of columns within the data chunk, or whether any of the preceding items exceed a predetermined threshold. The condition may also be whether a certain data chunk has substantially more unusable columns then other data chunks. Thus, the condition may be some quantity, statistic, metric, or Boolean value associated with each data chunk.

In some embodiments, block 704 may include blocks 706 and 708. At block 706, a number of unusable columns that belong to each individual data chunk is determined. At block 708, it is determined whether the number of unusable columns that belong to each individual data chunk exceeds a threshold. Operations performed in blocks 706 and 708 may be consistent with those described in reference to FIG. 4.

At block 710, a mapping between one or more backup columns and one or more unusable columns is generated based on the condition. Performance of block 710 may result in each of the one or more backup columns being mapped to a different unusable column. The mapping may include erasing the address of the unusable column from the controller's firmware and replacing it with the address of the backup column. The mapping performed in block 710 may be consistent with that described in reference to FIG. 4. For example, based on a condition associated with a particular data chunk (e.g., whether the number of unusable columns in the data chunk exceeds a threshold), controller 120 may determine that a number of backup columns should be mapped to the unusable columns in the data chunk. In some embodiments, the mapping is based on determining whether the number of unusable columns that belong to each individual data chunk exceeds a threshold. For example, a particular unusable column may be mapped to a particular backup column only if the number of unusable columns that belong to a particular data chunk to which the particular column belongs exceeds the threshold.

At block 712, the plurality of data chunks are modified such that at least one of the plurality of columns changes with respect to which data chunk it belongs. For example, controller 120 may modify the size of the data chunks or the configuration of the data chunks, as described in reference to FIG. 6. After performance of block 712, process 700 may proceed to block 704 and the condition associated with each individual data chunk of a plurality of data chunks may be reevaluated or redetected. Additionally, block 702 may be performed after block 712 to determine whether the identified unusable columns have changed.

What is claimed is:

1. A memory device comprising:
   a memory including:
      a plurality of memory cells for storing data;
      a plurality of columns including a first subset of the plurality of memory cells, wherein each of the plurality of columns belongs to one of a plurality of data chunks; and
      one or more backup columns including a second subset of the plurality of memory cells; and
   a controller communicatively coupled to the memory and configured to perform operations including:
      identifying one or more unusable columns of the plurality of columns;
      detecting a condition associated with each individual data chunk of the plurality of data chunks; and
      generating a mapping between the one or more backup columns and the one or more unusable columns based on the condition such that each of the one or more backup columns is mapped to a different unusable column.

2. The memory device of claim 1, wherein detecting the condition associated with each individual data chunk of the plurality of data chunks includes:
   determining a number of unusable columns that belong to each individual data chunk; and
   determining whether the number of unusable columns that belong to each individual data chunk exceeds a threshold.

3. The memory device of claim 2, wherein the threshold is proportional to a number of bit errors that can be tolerated in each individual data chunk using an error correction scheme.

4. The memory device of claim 2, wherein the mapping is based on determining whether the number of unusable columns that belong to each individual data chunk exceeds the threshold such that, a particular unusable column is mapped to a particular backup column only if the number of unusable columns that belong to a particular data chunk to which the particular column belongs exceeds the threshold.

5. The memory device of claim 2, wherein the mapping is based on determining whether the number of unusable columns that belong to each individual data chunk exceeds the threshold such that, for each individual data chunk, the number of unusable columns that belong to the individual data chunk minus a number of backup columns that are mapped to the unusable columns that belong to the individual data chunk is less than the threshold.

6. The memory device of claim 1, wherein the operations further include:
   modifying the plurality of data chunks such that at least one of the plurality of columns changes with respect to which data chunk it belongs.

7. The memory device of claim 6, wherein the operations further include:
   modifying the mapping such that at least one of the one or more unusable columns changes with respect to which backup column it is mapped to.

8. The memory device of claim 1, wherein a particular backup column is mapped to a particular unusable column such that the particular backup column is used for storing data instead of the particular unusable column.

9. The memory device of claim 1, wherein the error correction scheme is error correcting coding (ECC).

10. A method for generating a mapping between one or more unusable columns and one or more backup columns within a memory, the method comprising:
    identifying the one or more unusable columns of a plurality of columns;
    detecting a condition associated with each individual data chunk of a plurality of data chunks; and
    generating the mapping between the one or more backup columns and the one or more unusable columns based on the condition such that each of the one or more backup columns is mapped to a different unusable column;
    wherein the memory includes:
       a plurality of memory cells for storing data;
       the plurality of columns including a first subset of the plurality of memory cells, wherein each of the plurality of columns belongs to one of the plurality of data chunks; and
       the one or more backup columns including a second subset of the plurality of memory cells.

11. The method of claim 10, wherein detecting the condition associated with each individual data chunk of the plurality of data chunks includes:
    determining a number of unusable columns that belong to each individual data chunk; and
    determining whether the number of unusable columns that belong to each individual data chunk exceeds a threshold.

12. The method of claim 11, wherein the threshold is proportional to a number of bit errors that can be tolerated in each individual data chunk using an error correction scheme.

13. The method of claim 11, wherein the mapping is based on determining whether the number of unusable columns that belong to each individual data chunk exceeds the threshold such that, a particular unusable column is mapped to a particular backup column only if the number of unusable columns that belong to a particular data chunk to which the particular column belongs exceeds the threshold.

14. The method of claim 11, wherein the mapping is based on determining whether the number of unusable columns that belong to each individual data chunk exceeds the threshold such that, for each individual data chunk, the number of unusable columns that belong to the individual data chunk minus a number of backup columns that are mapped to the unusable columns that belong to the individual data chunk is less than the threshold.

15. The method of claim 10, further comprising:
modifying the plurality of data chunks such that at least one of the plurality of columns changes with respect to which data chunk it belongs.

16. The method of claim 15, further comprising:
modifying the mapping such that at least one of the one or more unusable columns changes with respect to which backup column it is mapped to.

17. The method of claim 10, wherein a particular backup column is mapped to a particular unusable column such that the particular backup column is used for storing data instead of the particular unusable column.

18. The method of claim 10, wherein the error correction scheme is error correcting coding (ECC).

19. A controller communicatively coupled to a memory, the controller configured to perform operations comprising:
identifying one or more unusable columns of a plurality of columns;
detecting a condition associated with each individual data chunk of a plurality of data chunks; and
generating a mapping between one or more backup columns and the one or more unusable columns based on the condition such that each of the one or more backup columns is mapped to a different unusable column;
wherein the memory includes:
a plurality of memory cells for storing data;
the plurality of columns including a first subset of the plurality of memory cells, wherein each of the plurality of columns belongs to one of the plurality of data chunks; and
the one or more backup columns including a second subset of the plurality of memory cells.

20. The controller of claim 19, wherein detecting the condition associated with each individual data chunk of the plurality of data chunks includes:
determining a number of unusable columns that belong to each individual data chunk; and
determining whether the number of unusable columns that belong to each individual data chunk exceeds a threshold.

* * * * *